United States Patent [19]
Baskett et al.

[11] 3,957,537
[45] May 18, 1976

[54] MODULES COMPRISING PHOTO-CELLS

[75] Inventors: Arthur Colin Baskett, Welwyn Garden City; Peter Michael Riddle, Royston, both of England

[73] Assignee: Imperial Chemical Industries Limited, London, England

[22] Filed: Sept. 6, 1974

[21] Appl. No.: 504,667

[30] Foreign Application Priority Data
Sept. 14, 1973 United Kingdom............... 43276/73

[52] U.S. Cl.................................. 136/89; 156/99; 29/572
[51] Int. Cl.² .................... H01L 31/04; C03C 27/10
[58] Field of Search ............ 136/89; 29/572; 156/99

[56] References Cited
UNITED STATES PATENTS

| | | | |
|---|---|---|---|
| 3,117,296 | 1/1964 | Leshem............................ | 136/89 X |
| 3,411,050 | 11/1968 | Middleton et al. ................ | 136/89 X |
| 3,533,850 | 10/1970 | Tarneja et al........................ | 136/89 |
| 3,539,883 | 11/1970 | Harrison............................ | 136/89 X |
| 3,620,847 | 11/1971 | Wise..................................... | 136/89 |
| 3,657,038 | 4/1972 | Lightfoot........................ | 156/99 X |
| 3,780,424 | 12/1973 | Forestieri........................ | 136/89 X |
| 3,849,880 | 11/1974 | Haynos............................ | 136/89 X |

*Primary Examiner*—John H. Mack
*Assistant Examiner*—Aaron Weisstuch
*Attorney, Agent, or Firm*—Cushman, Darby & Cushman

[57] ABSTRACT

Modules comprising photo-cells encapsulated in laminates comprising at least one rigid member and at least one transparent member laminated together by a transparent hot melt adhesive such as plasticised polyvinyl butyral or an ethylene copolymer. The preferred members are glass sheets and the preferred ethylene copolymer is a terpolymer of ethylene, methylmethacrylate and methacrylic acid. In a modification of the invention the hot melt adhesive need not be transparent provided that in the laminate it merely surrounds the photo-cell and does not cover its light-sensitive surface.

11 Claims, 4 Drawing Figures

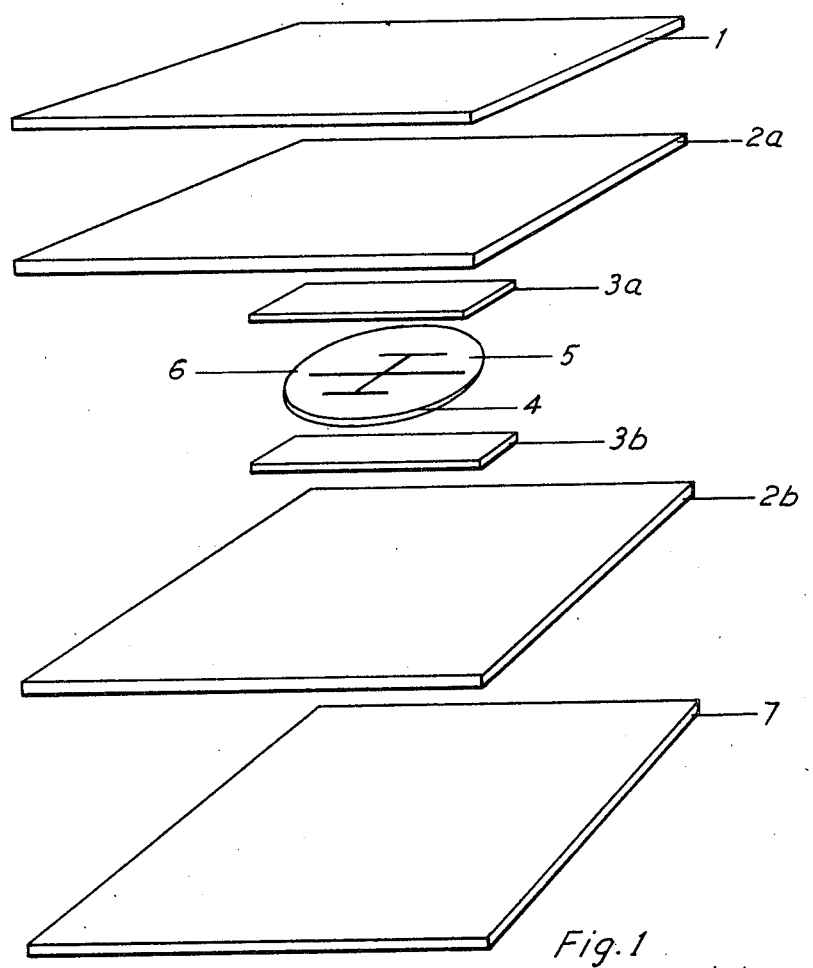
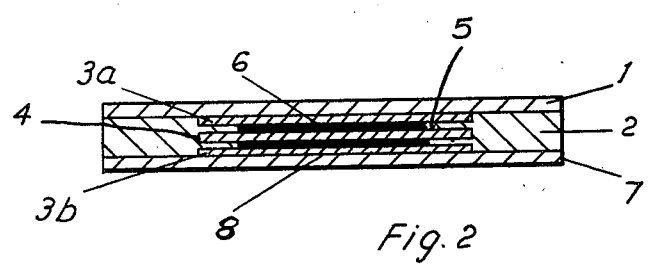

MODULES COMPRISING PHOTO-CELLS

This invention relates to light-responsive modules comprising photo-cells.

Commercially available photo-cells such as solarcells usually comprise a thin wafer of a semiconductor such as silicon doped with atoms of another element such as phosphorus and one surface of the wafer is impregnated with a different material such as boron. It is found that the boron-impregnated surface responds to incident light (especially visible and infra-red light) in such a way that an electrical potential difference is established between the boron-impregnated surface and the remainder of the wafer. This potential difference can be used to drive a current around a circuit external to the wafer. Photo-cells are also made from other materials such as those based on cadmium disulphide.

Commercially available solar-cells comprising brittle components such as a silicon wafer are brittle and so are usually protected against damage, particularly damage caused by bending, by enclosing them within modules composed of a transparent polycarbonate trough filled with a translucent silicone rubber. However, both polycarbonates and silicone rubbers are expensive materials and moreover the modules made from them are not very weather-resistant.

It has been proposed to encapsulate solar-cells in a block of acrylic resin. However, acrylic resins containing inserts are also not very weather-resistant and modules comprising acrylic resins would be highly combustible so that extensive fire precautions would be needed if for example large arrays of acrylic modules were to be built into the roofs of buildings in order to supply power to the buildings.

By this invention we provide a light-responsive module comprising one or more photo-cells encapsulated within a laminate comprising two members adhesively bonded together by means of a hot melt adhesive wherein at least one of the members is transparent and any hot melt adhesive lying between the light-sensitive surface of the photo-cell and a transparent member is itself also transparent, and at least one of the members is sufficiently rigid to enable the module to afford the photo-cell some protection against breakage by bending.

The rigid member forming part of the module is preferably in the form of a sheet which should be of sufficient thickness to enable the module to be more resistant to bending than is the photo-cell. The rigid member may be made for example from metal or synthetic resins or glass and need only be transparent in so far as it is to be positioned over the light-sensitive surface of the photo-cell.

The transparent member forming part of the module may be in the form of a sheet or a lens shaped so as to focus an increased amount of light on to the photo-cell. The preferred transparent material is glass. Glass is highly weather resistant, incombustible, transparent to visible light and quite strong when laminated by means of a suitable hot melt adhesive. A preferred glass is soda-lime silicate glass which is not transparent to ultra-violet light of wavelengths below about 300 nm and so is capable of protecting the hot melt adhesive from the effects of ultra-violet light of these wave-lengths, exposure to which would cause the hot melt adhesive to degrade over a period of time. Acrylic resins may be used for the transparent member instead of glass but they are less resistant to weather and are gradually degraded by ultra-violet light.

By the term "hot melt adhesive" we mean an adhesive which can be applied to the surface to which it is intended it should adhere by contacting the surface with the molten adhesive and subsequently cooling the surface and the adhesive so as to cause the adhesive to solidify and adhere to the surface. Examples of hot melt adhesives are given in the review "Hot Melt Adhesives" by M McDonald and published by the Noyes Data Corporation and in "Engineering Handbook of Adhesives" edited by D F Aitken and published by the Machinery Publishing Company.

Preferably the transparent hot melt adhesives used in the performance of this invention should have transmittances of visible light comparable to that of clear colourless soda-lime silicate glass. Examples of suitable hot melt adhesives include polyvinyl butyrals, preferably plasticised polyvinyl butyral and certain copolymers of ethylene. A description of commercially available plasticised polyvinyl butyrals is provided on pages 311 to 315 of volume 21 of the second edition of "The Encyclopedia of Chemical Technology" edited by R E Kirk and D F Othmer and published by the Interscience Division of John Wiley and Sons of New York. Most commercially available plasticised polyvinyl butyrals contain from 11 to 25% by weight of copolymerised vinyl alcohol units and from 0.5 to 5% by weight of copolymerised vinyl acetate units together with small amounts of alkalimetal or alkaline-earth metal salts. Typical plasticisers used in plasticised polyvinyl butyrals include dibutyl phthalate or sebacate, tributyl citrate or tricresyl phosphate.

Ethylene copolymers suitable for use in the performance of this invention include copolymers of ethylene and from 6.9 to 14 mole % of one or more unsaturated carboxylic acids and/or one or more unsaturated esters of carboxylic acids. It is preferred that the copolymer be a terpolymer comprising from 2.6 to 7.8 mole % of copolymerised acrylic or methacrylic acid together with a sufficient amount of copolymerised ester to bring the amount of co-monomer in the terpolymer to from 6.9 to 14 mole %. Examples of suitable esters include the methyl, ethyl, butyl, 2-ethyl hexyl, cyclohexyl, lauryl, glycidyl and hydroxyethyl or hydroxypropyl esters of acrylic or methacrylic acids. Other suitable esters are vinyl formate, vinyl benzoate and in particular vinyl acetate. A particularly preferred terpolymer comprises ethylene, 3.85 to 6.10 mole % of acrylic or methacrylic acid and sufficient of a methyl, ethyl or butyl ester of acrylic or methacrylic acid to bring the total amount of co-monomer in the terpolymer to 78 to 14 mole % as described in Belgian Pat. specification No. 794 225. The melt flow index of the ethylene copolymer as measured according to British Standard 2782: Part 1/105C/1970 using a 2.16 kg load should preferably be in the range 0.1 to 20 g/10 mms. If the module is to be installed on a buoy or in other locations where wet conditions or extremes of temperature are likely to be encountered it is preferred to choose copolymers having melt flow indices of from 0.5 to 2.0 g/10 minutes and copolymers having melt flow indices of from 0.8 to 1.4 g/10 minutes are particularly preferred.

The copolymers may be prepared by the known process of ethylene polymerisation at high pressure, the mixture of comonomers being polymerised at a pressure above 100 MN/m² (1000 atmospheres), in the presence of a free radical polymerisation initiator, and at elevated temperature, suitably 120°C to 250°C. The monomers are introduced in the proportions found to give the desired proportions in the copolymer under the conditions of reaction. To make copolymers of the highest transparency it is preferred that a well-stirred continuous autoclave reactor be used.

One possible method for making a module according to this invention is to insert the photo-cell into a sheet-defining mould filled with molten transparent hot melt adhesive and then to allow the mould to cool slowly so as to produce a solid sheet of hot melt adhesive which encapsulates the photo-cell. The sheet is then sandwiched between a transparent and a rigid member of the kind hereinbefore described and the sandwich subjected to heating and cooling in order to cause the hot melt adhesive to adhere to the members and produce a laminate. If the hot melt adhesive is plasticised polyvinyl butyral it may be necessary to re-heat the laminate in an autoclave in order to obtain the optimum degree of transparency. If the hot melt adhesive is an ethylene copolymer it may be desirable to cool the laminate at a rate greater than 20°C per minute by for example plunging it into warm water in order to obtain the optimum degree of transparency. Removal of the sheet of hot melt adhesive from the sheet-defining mould is greatly facilitated by lining the mould with a film of polyethylene terephthalate or similar material to which the hot melt adhesive does not form any substantial adhesive bond.

Modules made by methods involving insertion of the photo-cells into molten hot melt adhesive require skill in order to position the photo-cells and to maintain them in the correct position until the hot melt adhesive has solidified. In particular where a module comprises two or more encapsulated photo-cells, it is usually desirable to position the photo-cells so that their light-sensitive surfaces are coplanar. An alternative method of making modules according to this invention which enables the photo-cells to be more easily positioned comprises placing the photo-cells between sheets of transparent hot melt adhesive and then sandwiching the sheets between the rigid and transparent members and converting the sandwich to a laminate by heating and cooling as hereinbefore described. The sheets of hot melt adhesive preferably have a thickness of from 0.05 mm to 1.15 mm.

Preferably the heating and cooling procedure which is carried out to convert the sandwiches into laminates should be carried out under a pressure of about 0.5 to 0.15 MN/m². This may be achieved by subjecting the sandwich to the action of a press or by assembling the sandwich and then placing the assembly in a flexible plastics or rubber bag which is subsequently thoroughly evacuated and heated. If the pressure is applied too quickly, the resulting flow in the molten hot melt adhesive may cause the photo-cell to break. This problem can be alleviated by adhesively bonding to the photo-cell a film of a transparent material such as regenerated cellulose acetate or polyethylene terephthalate which has a melting point substantially above the highest temperature to which the sandwich is likely to be subjected that is to say the melting point of the film is at least greater than the melting point of the hot melt adhesive. The film may be bonded to the photo-cell by means of a pressure sensitive adhesive provided on the film.

An alternative way of reducing the risk of damage caused by flow within the molten hot melt adhesive is to use a sheet of hot melt adhesive having a thickness similar to that of the photo-cell and having one or more apertures cut into it which match the shape of the photo-cells. A photo-cell is lodged in each aperture and the sheet is then sandwiched between two members. The sandwich is converted into a laminate as hereinbefore described and a module is obtained which comprises one or more photo-cells encapsulated in a laminate comprising the two members adhesively bonded together by means of a hot melt adhesive which surrounds the photo-cells. In this instance the hot melt adhesive need not be transparent. Accordingly we also provide as a preferred embodiment of this invention a module comprising one or more photo-cells having a light-sensitive surface encapsulated within a laminate comprising two members adhesively bonded together by means of a transparent or opaque hot melt adhesive which does not cover the light-sensitive surface to any substantial extent and wherein the members are rigid and/or transparent to the extents as hereinbefore required. When the photo-cell is not covered by hot melt adhesive there is no substantial bond between the photo-cell and the rigid and/or transparent members of the photo-cell is better able to withstand stresses arising from the different rates of expansion of the photo-cell and the members.

In a further alternative method of performing this invention a photo-cell is stuck on to the rigid member by means of any convenient adhesive such as a solution based adhesive or a pressure adhesive and then a sheet of hot melt adhesive is laid over the photo-cell and the rigid member. The sandwich is completed by laying the transparent member on the sheet of hot melt adhesive and then the sandwich is converted to a laminate as hereinbefore described.

Location of the photo-cells within a laminate may be assisted by accommodating one or more photo-cells in a frame or similar structure which can be more easily held in place between the rigid and transparent members while lamination is being carried out. In particular the frame may be provided with lugs which engage the edges of one or other of the rigid and transparent members.

The boron-impregnated surface of a silicon wafer type of solar cell and a surface of the remaining part of the wafer are usually provided with metal conductors by means of which the potential difference between the surfaces can be transmitted to a circuit external of the wafer. Means for connecting these conductors to an external circuit may also be incorporated in the module. Alternatively holes may be drilled into the module to meet the surfaces of the photo-cells and contact with the metal conductors on the surfaces of the photo-cells may be made by inserting conductors through these holes.

The invention is illustrated by the following drawings in which

FIG. 1 is an exploded perspective view of a sandwich used in the performance of this invention.

FIG. 2 is a section of a laminate made from the sandwich shown in FIG. 1.

Figure 3:
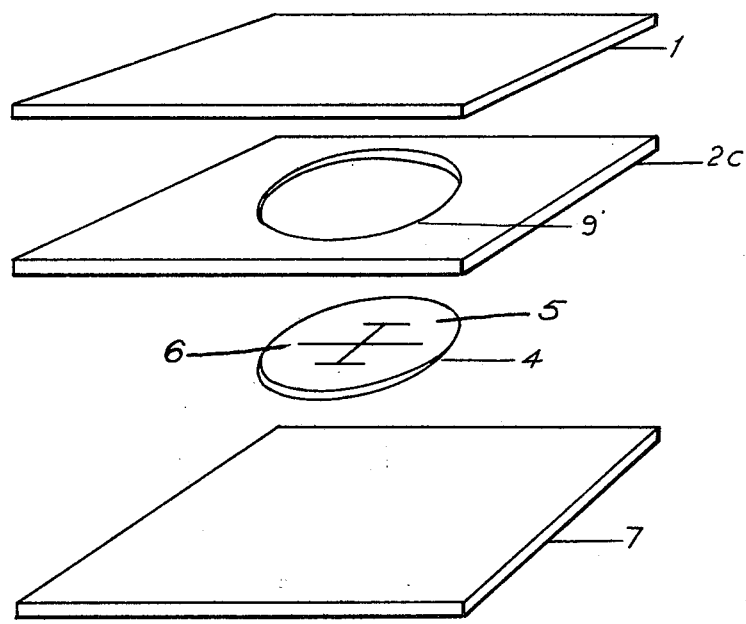
FIG. 3 is an exploded perspective view of an alternative to the sandwich shown in FIG. 2.

FIG. 1 shows a transparent member 1, a first sheet of transparent hot melt adhesive 2a, a first film of "Sellotape" 3a provided with a coating of pressure sensitive adhesive on its lower surface, a photo-cell comprising a wafer 4 of semiconductor having a light-responsive surface 5 provided with metal conductors 6, a second film of "Sellotape" 3b provided with a coating of pressure sensitive adhesive on its upper surface, a second sheet of hot melt adhesive 2b and a sheet of rigid material 7. Metal conductors 8 are provided on the base of photo-cell 4 as shown in FIG. 2. The module shown in FIG. 2 made by laminating the sandwich shown in FIG. 1 comprises photo-cell 4 encapsulated within a layer of hot melt adhesive 2 which adhesively bonds together transparent sheet 1 and rigid sheet 7.

Figure 4:
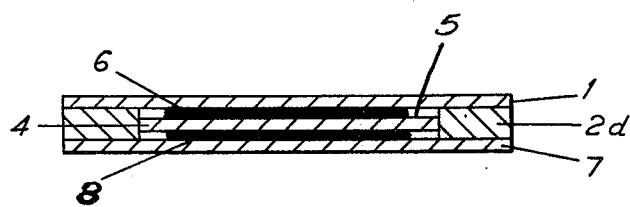
FIG. 4 is a section of a laminate made from the sandwich shown in FIG. 3.

FIG. 3 shows an alternative to the sandwich shown in FIG. 1 wherein sheets 2a and 2b are replaced by sheet 2c containing a hole 9 shaped to match the shape of photo-cell 4. FIG. 4 shows a module obtained by laminating the sandwich shown in FIG. 3. The module comprises photo-cell 4 encapsulated within sheets 1 and 7 and a layer of hot melt adhesive 2d derived from sheet 2c. Layer 2d does not extend over light-sensitive surface 6 to any significant extent.

The invention is also illustrated by the following Examples.

EXAMPLE 1

A film of regenerated cellulose acetate provided with a coating of pressure sensitive adhesive on one surface and sold under the trade name "Sellotape" was stuck on to the light-responsive surface of a silicon wafer photo-cell. A second film of "Sellotape" was stuck on to the back surface of the photo-cell. The photo-cell was then placed between two sheets of plasticised polyvinyl butyral which were 0.76 mm thick. The sheets were then sandwiched between two sheets of polymethyl methacrylate each 15 mm thick. An exploded view of the sandwich is shown in FIG. 1. The sandwich was then heated to 120°C to 130°C and subjected to a pressure of 0.1 MN/m$^2$ by means of a hand press. On cooling to room temperature a module as illustrated in FIG. 2 was obtained.

EXAMPLE 2

Example 1 was repeated using sheets of an ethylene copolymer instead of plasticised polyvinyl butyral. The ethylene copolymer was a copolymer of ethylene with 13% by weight of methacrylic acid and 13% by weight of methylmethacrylate and having a melt flow index of 0.89 g/10 minutes. The sandwich was heated as in Example 1 but instead of allowing it to cool slowly it was cooled to 40°C at a rate of 30°C per minute and then allowed to cool slowly to room temperature. A module was obtained which was comparable to that obtained using plasticised polyvinyl butyral.

EXAMPLE 3

Example 1 was further repeated using sheets of soda-lime silicate glass 3 mm thick instead of sheets of polymethylmethacrylate. A module was obtained which was at least as satisfactory as those obtained using sheets of polymethylmethacrylate.

EXAMPLE 4

A circular piece of brittle material chosen to simulate the more expensive silicon-wafer photo-cells used in Examples 1 to 3 was inserted as an interference fit into a circular hole cut into a sheet of plasticised polyvinyl butyral. The sheet of plasticised polyvinyl butyral and its insert were then sandwiched between two sheets of polymethylmethacrylate each 15 mm thick. An exploded view of the sandwich is shown in FIG. 3. The sandwich was then converted to a laminate as described in Example 1 and a module as illustrated in FIG. 4 was obtained. The module was comparable to those obtained according to Examples 1, 2 or 3.

The modules obtained according to Examples 1, 2, 3 and 4 could not be bent sufficiently by hand to cause the photo-cell or (in the case of Example 4) the brittle material to break. Example 4 was subsequently repeated successfully firstly using a silicon wafer photo-cell instead of the brittle material and secondly using the ethylene copolymer of Example 2 instead of plasticised polyvinyl butyral.

The glass surfaces to be bonded may if desired be treated with an adhesion promoter before the sandwich is assembled. For example, silanes of the type described in British Pat. specification No. 1 095 700 may be used for this purpose.

We claim:

1. A light-responsive module comprising one or more photo-cells encapsulated within a laminate comprising two opposed members adhesively bonded together by means of a hot melt adhesive wherein at least one of the members is transparent and any hot melt adhesive lying between the light-sensitive surface of the photo-cell and a transparent member is itself also transparent, and at least one of the members is sufficiently rigid to enable the module to afford the photo-cell protection against breakage by bending.

2. A module as claimed in claim 1 wherein the transparent member is made from glass.

3. A module as claimed in claim 1 wherein the hot melt adhesive is a plasticised polyvinyl butyral or an etylene copolymer.

4. A module as claimed in claim 3 wherein the hot melt adhesive is an ethylene copolymer comprising from 6.9 to 14 mole % of a member selected from the group consisting of at least one unsaturated carboxylic acid, at least one unsaturated ester of a carboxylic acid and mixtures thereof.

5. A module according to claim 1 wherein a film of transparent material having a melting point greater than the melting point of the hot melt adhesive is provided between one of the members of the module and at least a portion of a surface of the photo-cell and is adhesively bonded to the surface of the photo-cell.

6. A module according to claim 1 comprising at least one photo-cell having a light-sensitive surface encapsulated within a laminate comprising two members adhesively bonded together by means of a transparent or opaque hot melt adhesive which does not cover the light-sensitive surface to any substantial extent.

7. A module according to claim 1 wherein the photo-cell is adhesively bonded to a rigid member of the module by means of a solvent based or pressure-sensitive adhesive.

8. A module according to claim 1 wherein the photo-cell is accommodated in a frame which forms part of the module.

9. A light-responsive module as claimed in claim 1 wherein at least one photo-cell and at least one sheet of hot melt adhesive are sandwiched between opposed members and the sandwich is heated and cooled so as to cause the opposed members to become adhesively bonded toether.

10. A light-responsive module according to claim 9 wherein a film of transparent material having a melting point above the melting point of the hot melt adhesive is adhesively bonded to at last a portion of a surface of the photo-cell before the photo-cell is sandwiched between the opposed members.

11. A light responsive module according to claim 9 wherein the sheet of hot melt adhesive is provided with at least one aperture which matches the shape of a photo-cell and a photo-cell is inserted into the aperture before the photo-cell sheet are sandwiched between the opposed members.

* * * * *